United States Patent
Arik et al.

(10) Patent No.: US 7,095,110 B2
(45) Date of Patent: Aug. 22, 2006

(54) LIGHT EMITTING DIODE APPARATUSES WITH HEAT PIPES FOR THERMAL MANAGEMENT

(75) Inventors: Mehmet Arik, Niskayuna, NY (US); Stanton Earl Weaver, Jr., Northville, NY (US); Charles Becker, Schenectady, NY (US)

(73) Assignee: GELcore, LLC, Valley View, OH (US)

( * ) Notice: Subject to any disclaimer, the term of this patent is extended or adjusted under 35 U.S.C. 154(b) by 68 days.

(21) Appl. No.: 10/851,273

(22) Filed: May 21, 2004

(65) Prior Publication Data

US 2005/0258438 A1    Nov. 24, 2005

(51) Int. Cl.
*H01L 23/10* (2006.01)
(52) U.S. Cl. .................... 257/712; 257/714
(58) Field of Classification Search ............ 257/712
See application file for complete search history.

(56) References Cited

U.S. PATENT DOCUMENTS

| | | | |
|---|---|---|---|
| 6,252,726 B1 | 6/2001 | Verdiell | |
| 6,330,259 B1 * | 12/2001 | Dahm | 372/35 |
| 6,661,544 B1 | 12/2003 | Okino et al. | |
| 2005/0006754 A1 * | 1/2005 | Arik et al. | 257/712 |
| 2005/0158687 A1 * | 7/2005 | Dahm | 433/29 |

FOREIGN PATENT DOCUMENTS

| | | |
|---|---|---|
| GB | 2 387 025 | 10/2003 |
| WO | WO 2003081127 A2 * | 10/2003 |
| WO | WO 2004/011848 | 2/2004 |

OTHER PUBLICATIONS

U.S. Appl. No. 10/614,497, filed Jul. 2003, Weaver et al.

* cited by examiner

*Primary Examiner*—Thomas L. Dickey
(74) *Attorney, Agent, or Firm*—Fay, Sharpe, Fagan, Minnich & McKee, LLP

(57) ABSTRACT

A light emitting apparatus (10, 110, 210, 310, 410) includes one or more light emitting diode chips (12, 112, 212, 312, 412) disposed on a chip support wall (16, 116, 216) including printed circuitry (34, 134, 234, 360, 362, 460, 462) connecting with the light emitting diode chips. A heat pipe (24, 124, 224, 324, 424) has a sealed volume (22, 122, 222, 322, 422) defined by walls including the chip support wall and at least one additional wall (18, 20, 118, 120, 218). The heat pipe further includes a heat transfer fluid (26, 226, 326, 426) disposed in the sealed volume.

18 Claims, 5 Drawing Sheets

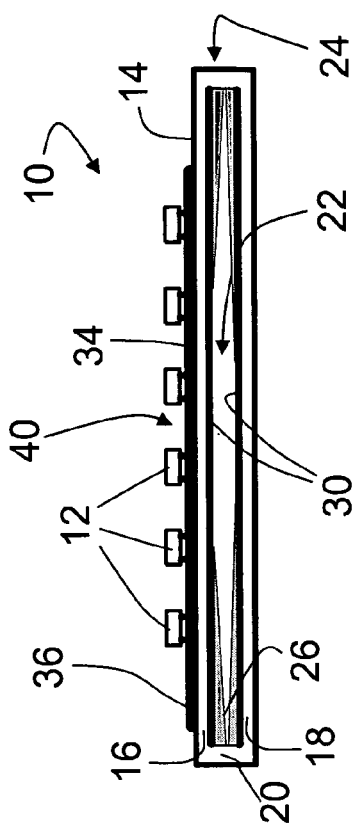
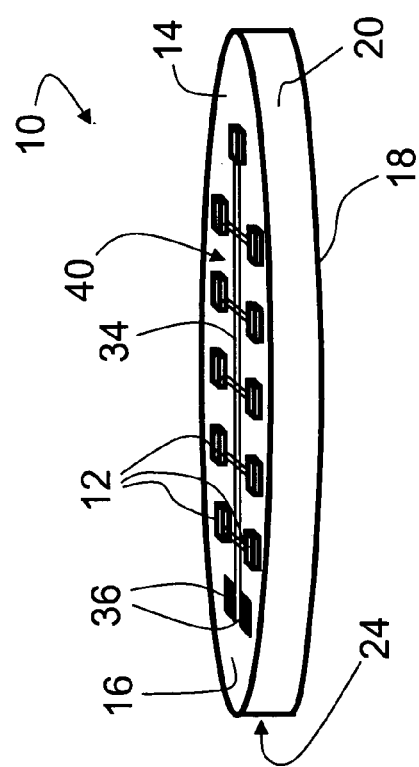

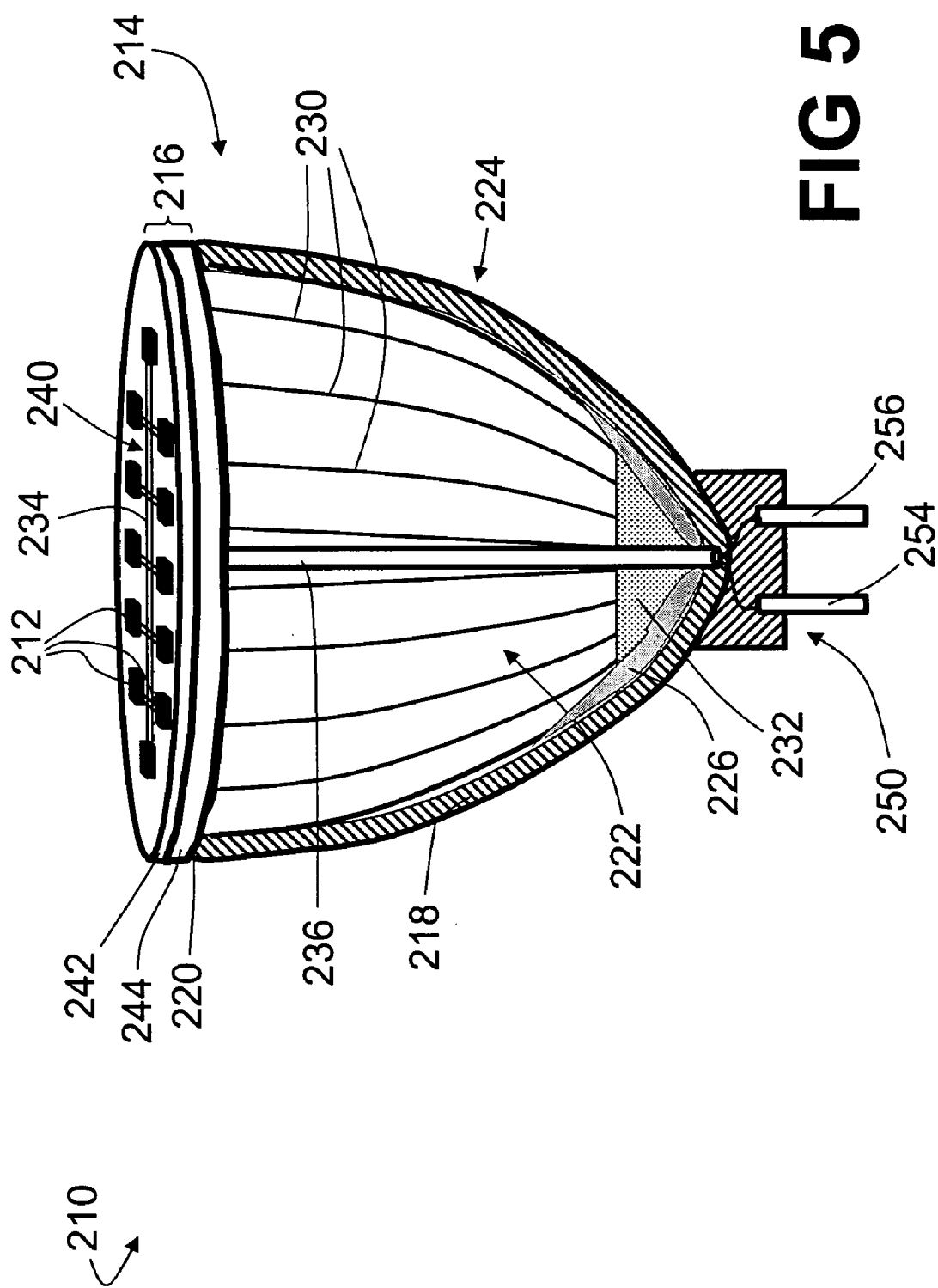

LIGHT EMITTING DIODE APPARATUSES WITH HEAT PIPES FOR THERMAL MANAGEMENT

BACKGROUND

The present invention relates to the lighting arts. It especially relates to high intensity light emitting diode packages, components, apparatuses, and so forth, and will be described with particular reference thereto. However, the invention will also find application in conjunction with other solid state light emitters such as vertical cavity surface emitting lasers.

High power light emitting diode packages employ one or more light emitting diode devices operating at relatively high current levels to produce high brightness or high light output intensities. A light emitting diode chip has a voltage drop which typically is determined largely by the band gap of the material. The operating voltage of a light emitting diode chip is typically about 4 volts or less. Thus, generating high light output intensities involves increasing the operating current. A high operating current, in turn, leads to high resistive losses in cladding layers, electrodes, wire bonds, printed circuit traces, or other electrically resistive elements in the current path of the light emitting diode package.

These resistive losses translate into substantial heating of the light emitting diode package when operated at high power levels. Heating can produce thermal degradation of the light emitting diode chip, the chip electrodes, sealing encapsulant, solder bumps, or other components of the light emitting diode package. Moreover, heating generally increases the resistance of the electrical pathways and can reduce the light emitting diode operating efficiency. As a consequence, the light output power increase is proportionally smaller than the input electrical power increase.

Various thermal management techniques have been employed in light emitting diode packages. Encapsulating epoxies, sub-mounts, and the like are selected to provide high thermal conductivity to promote heat transfer away from the operating light emitting diode chip. Heat sinks are provided to collect and dissipate the generated heat. Chip electrodes are laterally distributed across the chip to provide current and heat distribution. Encapsulants and other thermally sensitive materials are chosen for good thermal stability and robustness. These design techniques reduce, but do not eliminate, thermal concerns in high brightness light emitting diode packages.

In some light emitting diode apparatuses, one or more tubular heat pipes are used to transfer heat away from the light emitting diode chips. Heat pipes include a heat transfer fluid, such as water, that undergoes a condensation/evaporation cycle to provide efficient heat transfer. In this cycle, the liquid evaporates in a hotter region of the heat pipe, absorbing heat during the evaporation. The gas phase material flows into a cooler region of the heat pipe where it condenses back into liquid form, releasing the absorbed heat during the condensation. A wick such as a groove, wire mesh, metal powder, or fibrous structure, is sometimes provided to promote return of the condensed liquid to the hotter region by capillary or wicking action. A condenser may also be provided in the cooler region to promote condensation.

Heat pipes have found some application in light emitting diode devices. For example, Board et al., GB 2,387,025, discloses a tubular heat pipe arranged to carry heat away from a light emitting device disposed at one end of the tubular heat pipe. A Peltier thermoelectric device is disposed between the light emitting device and the heat pipe to improve thermal coupling therebetween.

The arrangement of Board et al. is not well suited for distributing heat across an array of light emitting diode devices. In such an array, thermal management issues include not only removal of heat from the array, but also providing substantially uniform distribution of heat across the array. The use of the Peltier thermoelectric device for thermal coupling of the light emitting diode device with the heat sink is also problematic, since it increases the complexity of the light emitting apparatus.

Okino et al., U.S. Pat. No. 6,661,544, disclose a tubular heat pipe curved in a planar serpentine pattern and disposed beneath a planar array of light emitting diode dice or chips. Such a planar serpentine heat pipe can be expected to improve thermal uniformity across the array. However, "hot spots" may still exist in regions between the serpentine legs. These hot spots can be problematic if some chips are disposed over a leg of the serpentine heat pipe, while other chips are disposed between the legs. Moreover, Okino et al. uses an active heat pipe in which liquid is pumped or otherwise actively flowed through the serpentine heat pipe. The liquid flow can be expected to introduce thermal non-uniformity between the inlet and outlet ends of the planar serpentine tubular heat pipe. Actively driven liquid flow also requires a fluid source and drain, or a closed-loop continuous liquid pumping system, which is unsuitable for many light emitting diode apparatuses and lighting applications.

The present invention contemplates improved apparatuses and methods that overcomes the above-mentioned limitations and others.

BRIEF SUMMARY

According to one aspect, a light emitting apparatus includes one or more light emitting diode chips and a passive heat pipe. The passive heat pipe includes: (i) a generally planar chip support wall on which the one or more light emitting diode chips are disposed; (ii) at least one additional wall sealed with the chip support wall to define a closed interior volume; (iii) a heat transfer fluid disposed in the closed interior volume; and (iv) one or more wicking structures disposed at least on an interior surface of the chip support wall.

According to another aspect, a light emitting apparatus is disclosed. One or more light emitting diode chips are disposed on a chip support wall that includes printed circuitry connecting with the light emitting diode chips. A heat pipe has a sealed volume defined by walls including the chip support wall and at least one additional wall. The heat pipe further includes a heat transfer fluid disposed in the sealed volume.

According to yet another aspect, a light emitting apparatus includes at least one light emitting diode chip and a heat pipe. The heat pipe has a sealed volume defined by: (i) a chip support wall on which the at least one light emitting diode chip is disposed; (ii) a backside wall; and (iii) one or more sidewalls extending between the chip support wall and the backside wall. A separation between the chip support wall and the backside wall is smaller than a lateral dimension of the chip support wall. The heat pipe further includes a heat transfer fluid disposed in the sealed volume.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the drawings, layer thicknesses, coating thicknesses, and other dimensions are not drawn to scale.

FIGS. 1A and 1B shows perspective and sectional views, respectively of a light emitting apparatus including a plurality of light emitting chips and a generally circular printed circuit board with an integral passive heat pipe.

In FIG. 3, the sealed interior volume and wicking structure components of the heat pipe are shown in phantom.

FIG. 5 shows a sectional view of a light emitting lamp head including a plurality of light emitting chips disposed on a metal core printed circuit board with an integral conical heat pipe-based heat sink.

DETAILED DESCRIPTION OF PREFERRED EMBODIMENTS

Figure 2B:
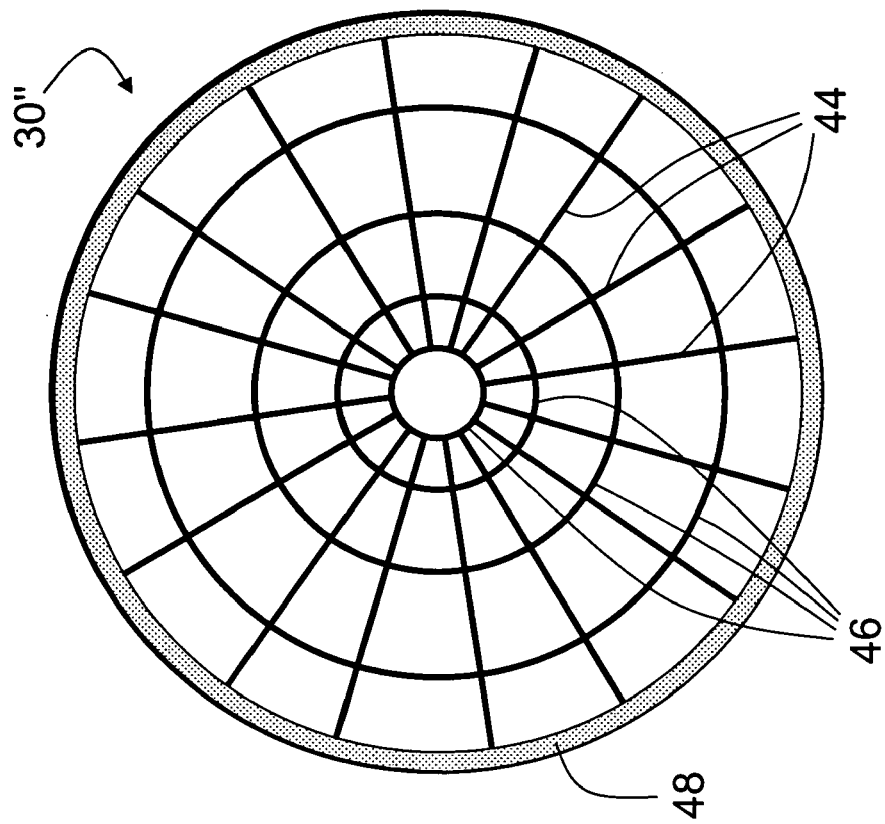
FIGS. 2A and 2B show plan view layouts of two suitable wicking structures for the heat pipe of the light emitting apparatus of FIGS. 1A and 1B.

With reference to FIG. 1, a light emitting package 10 includes a plurality of light emitting diode devices 12 disposed on a generally planar support 14 having a generally circular lateral area. The support 14 includes a first principal wall 16 on which the light emitting diode devices 12 are disposed, a second principal wall 18 opposite the first principal wall 16, and an annular sidewall 20 connecting the first and second principal walls 16, 18 to define a sealed interior volume 22 of a generally planar heat pipe 24. The sealed interior volume 22 is substantially defined by a gap between the first and second principal walls 16, 18. The principal walls 16, 18 preferably have lateral areas larger than the gap between the principal walls 16, 18, so that the support 14 is generally planar with a lateral area larger than its thickness.

A heat transfer fluid 26 such as water, methanol, or the like, is disposed in the interior volume 22. In FIG. 1 as well as in the other drawings, the liquid phase of the heat transfer fluid is represented in a highly diagrammatic fashion. In the operating passive heat pipes described herein, the heat transfer fluid undergoes an evaporation/condensation cycle including diffusive, capillary, or wicking movement of the liquid phase. Hence, the heat transfer fluid is generally in a dynamic equilibrium between liquid and gas phases, and the liquid phase may include liquid droplets, liquid films adsorbed onto surfaces, condensates, or so forth.

Wicking structures 30 are provided inside the sealed interior volume 22 disposed on an interior surface or surfaces of one or both of the first and second principal walls 16, 18. In the embodiment illustrated in FIG. 1, printed circuitry 34 disposed on the exterior surface first principal wall 16 connect the light emitting diode devices 12 with electrical power input pads 36 for delivering electrical power to the light emitting diode devices 12. Alternatively, the printed circuitry can be disposed inside of the first principal wall 16, for example between two electrically insulating layers that make up the first principal wall 16, in which case the printed circuitry is connected with the light emitting diode devices 12 on the exterior surface by electrical vias passing through the outer electrically insulating layer of the wall 16. The support 14 together with the printed circuitry 34 define a printed circuit board 40.

In operation, electrical power is applied to the electrical power input pads 36 to energize the light emitting diode devices 12. The operating light emitting diode devices 12 produce substantial amounts of heat, which tends to produce thermal non-uniformities across first principal wall 16 of the support 14. The relatively hotter regions are generally located near the center of the support 14, and the relatively cooler regions are generally located around extremities of the support 14 away from the light emitting diode devices 12. These temperature non-uniformities can lead to differences in the operating efficiency of the light emitting diode devices 12, which in turn can lead to brightness non-uniformity and possibly color non-uniformity in the light output of the light emitting package 10.

The generally planar heat pipe 24 reduces such lateral thermal non-uniformities by efficiently transferring heat away from the relatively hotter central region toward the relatively cooler outer extremities of the generally planar substrate 14. The heat pipe 24 is a passive heat pipe which does not include actively pumped inflow or outflow of heat transfer fluid. Rather, the heat transfer fluid 26 is sealed inside the sealed interior volume 22, and undergoes an evaporation/condensation cycle that effects heat transfer. Specifically, the heat transfer fluid 26 evaporates in the hotter regions near the heat-generating light emitting diode devices 12. The evaporation involves absorption of heat, including latent heat, into the evaporated gas phase. The evaporated gas phase of the heat transfer fluid 26 flows or diffuses away from the hotter regions toward the cooler regions, thus convectively transferring heat away from the light emitting diode devices 12. In the cooler regions, the gas phase condenses back into a liquid phase, releasing heat including latent heat in the condensation process. The condensed liquid flows back to the hotter regions, either by diffusion or, in the embodiment illustrated in FIG. 1, by capillary action or wicking in the wicking structures 30 which enhances liquid flow back to the hotter regions.

Figure 2A:
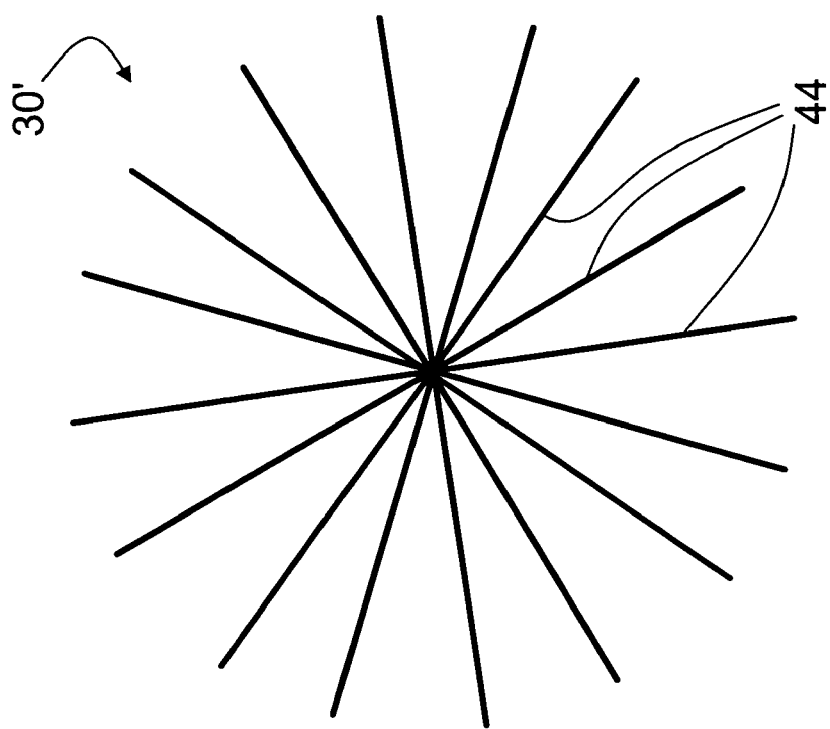

With reference to FIG. 2A, an example wicking structure 30' is shown. The wicking structure 30' is suitably disposed inside the interior volume 22 on an interior surface or surfaces of one or both of the first and second principal walls 16, 18. The wicking structure 30' includes a plurality of radiating wicks 44 radiating outward toward edges of the support 14. The wicks 44 can be grooves that are etched, cut, or otherwise formed on the interior surface or surfaces of one or both principal walls 16, 18, or the wicks 44 can be wires or micro-tubes disposed on the interior surface or surfaces of one or both principal walls 16, 18, or the wicks 44 can be structures of another type that promote capillary or wicking flow of the liquid phase of the heat transfer fluid 26 from the edges of the principal walls 16, 18 back toward the central regions of the first and second principal walls 16, 18.

With reference to FIG. 2B, another example wicking structure 30" is shown. The wicking structure 30" is suitably disposed inside the interior volume 22 on an interior surface or surfaces of one or both of the first and second principal walls 16, 18. The wicking structure 30" includes the plurality of radiating wicks 44 radiating outward toward edges of the support 14, and additionally includes a plurality of concentric annular wicks 46. The annular wicks 46 provide capillary flow or wicking paths transverse to the radiating wicks 44 to promote liquid flow transverse to the radiating wicks 44. The wicks 46 can be etched or cut grooves, wires, micro-tubes, or the like. The wicking structure 30" further includes an outer annular condenser 48 arranged around the wicks 44, 46 in the cooler regions to promote condensation of the gas phase of the heat transfer fluid 26 in the cooler regions. The condenser 48 can be, for example, a roughened or textured surface that provides increased surface area for condensation of the heat transfer fluid 26, a zeolite or other high surface area material that promotes condensation, a hydrophilic material in the case of a water-based heat transfer fluid, or the like.

Figure 3:
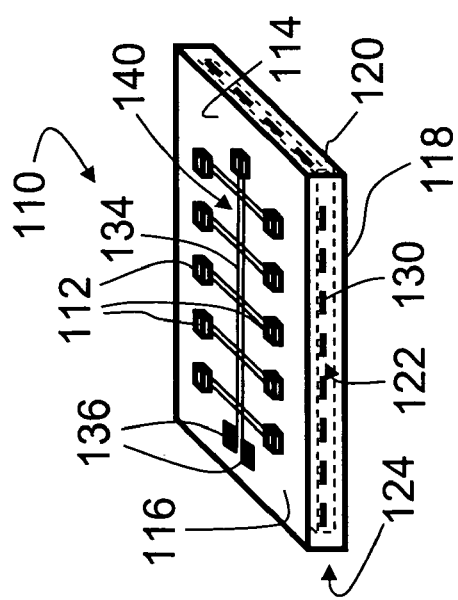
FIG. 3 shows a perspective view of a light emitting apparatus including a plurality of light emitting chips and a rectangular printed circuit board with an integral passive heat pipe.

With reference to FIG. 3, a light emitting package 110 includes a plurality of light emitting diode devices 112 disposed on a support 114. The support 114 includes a first principal wall 116 on which the light emitting diode devices 112 are disposed, a second principal wall 118 opposite the first principal wall 116, and sidewalls 120 connecting the first and second principal wall 116, 118 to define a sealed interior volume 122 (shown in phantom in FIG. 3) of a generally planar heat pipe 124. The sealed interior volume 122 is substantially defined by a gap between the first and second principal walls 116, 118. The principal walls 116, 118 preferably have lateral areas larger than the gap between the walls, so that the support 114 is generally planar with a lateral area larger than its thickness. Wicking structures 130 are disposed inside the sealed interior volume 122 on an interior surface or surfaces of one or both of the first and second principal walls 116, 118 (shown in phantom in FIG. 3, only on the interior surface of the first principal wall 116). Printed circuitry 134 disposed on the exterior surface of the first principal wall 116 connects the light emitting diode devices 112 with electrical power input pads 136 for delivering electrical power to the light emitting diode devices 112. The support 114 together with the printed circuitry 134 define a printed circuit board 140. The light emitting package 110 differs from the package 10 principally in that the generally planar support 114 is rectangular, while the support 14 is generally circular.

Figure 4B:
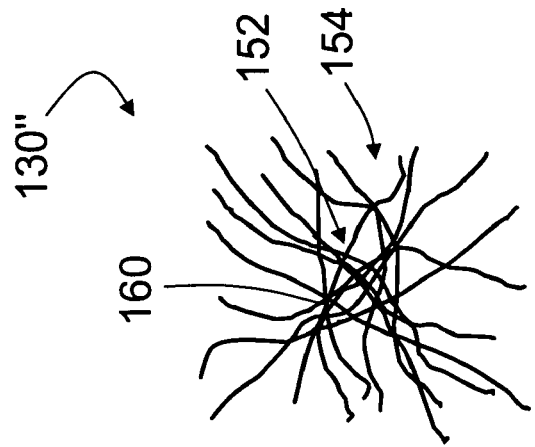
FIGS. 4A and 4B show plan view layouts of suitable powder-based and fibrous wicking structures, respectively, for the heat pipe of the light emitting apparatus of FIG. 3.
Figure 4A:
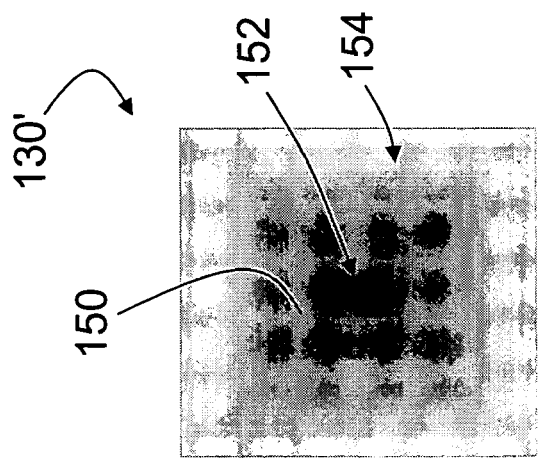

With reference to FIG. 4A, an example wicking structure 130' is shown. The wicking structure 130' is suitably disposed inside the interior volume 122 on an interior surface or surfaces of one or both of the first and second principal walls 116, 118. The wicking structure 130' includes a powder 150 of metal or another material that in the illustrated embodiment is more dense in a central region 152 of the support 114 and less dense in outer regions 154 of the support 114. The powder 150 promotes capillary or wicking movement of the liquid phase of the heat transfer fluid from the edge regions 154 to the central region 152. A powder of laterally uniform density may also provide advantageous capillary action or wicking. In other contemplated embodiments, a surface roughness or texturing is substituted for the powder 150.

With reference to FIG. 4B, another example wicking structure 130" is shown. The wicking structure 130" is suitably disposed inside the interior volume 122 on an interior surface or surfaces of one or both of the first and second principal walls 116, 118. The wicking structure 130" includes fibrous structures 160 generally radiating outward from the central region 152 of the support 114. The fibrous structures 160 promote capillary or wicking movement of the liquid phase of the heat transfer fluid from the edge regions 154 to the central region 152. In other embodiments, the fibrous structures 160 are absorbing for the heat transfer medium 126, and the liquid phase of the heat transfer medium 126 is drawn inward by absorptive wicking.

With reference to FIG. 5, a light emitting package 210 includes a plurality of light emitting diode devices 212 disposed on a support 214. The support 214 includes a generally planar first principal wall 216 on which the light emitting diode devices 212 are disposed, a second principal wall 218 opposite the first principal wall 216. The second principal wall 218 is concave, and the first and second principal walls 216, 218 are sealed together at a perimeter 220 to define a sealed interior volume 222. In other contemplated embodiments, the concave second principal wall 218 is replaced by one or more other adjoined planar and/or curved principal walls forming a tube, box, cone, or other volumetric structure having an open end selected to connect with the generally planar first principal surface 216.

The sealed volume 222 defines a passive heat pipe 224 operating using a heat transfer fluid 226 is disposed inside the sealed interior volume 222. Wicking structures 230 are disposed inside the sealed interior volume 222 on an interior surface or surfaces of the second principal wall 218 to facilitate transfer of the liquid phase of the heat transfer fluid 226 toward the first principal wall 216 by capillary action, absorptive wicking, or another physical mechanism. The wicking structures 230 can be grooves, wire mesh structures, metal powder, fibrous structures, or the like. In the embodiment illustrated in FIG. 5, a condenser 232 is disposed inside the sealed interior volume 222 on a portion of the second principal wall 218 distal from the first principal wall 216. The condenser 232 can, for example, be a roughened or textured interior surface or surfaces of the second principal wall 218. Alternatively, a zeolite or other high surface area structure can serve as the condenser 232. A hydrophilic material can be used for the condenser 232 in the case of a water-based heat transfer fluid. Although not shown in FIG. 5, additional wicking structures are optionally disposed inside the sealed interior volume 222 on the interior surface of the first principal wall 216. These additional wicking structures can, for example, have the layout of the wicking structure 30' shown in FIG. 2A or the layout of the wicking structure 30" shown in FIG. 2B.

Printed circuitry 234 disposed on the first principal wall 216 connects the light emitting diode devices 212 with an electrical conduit 236 for delivering electrical power to the light emitting diode devices 212. The first principal wall 216 thus corresponds to a printed circuit board 240. In the embodiment illustrated in FIG. 5 the printed circuit board 240 is a metal core printed circuit board, in which the first principal wall 216 includes an outer electrically insulating layer 242 on which the printed circuitry 234 is disposed and an inner metal core layer or other thermally conductive layer 244. Although not illustrated, it is also contemplated to include two or more outer insulating layers with one or more layers of printed circuitry disposed on or between the insulating layers.

In some embodiments, the perimeter 220 between the first and second principal walls 216, 218 is sealed by soldering the metal core 244 of the first principal wall 216 to edges or a lip of the open end of the second principal wall 218. In these embodiments, the second principal wall 218 (or at least the edges or lip of the open end thereof) is preferably made of a metal or other thermally conductive and solderable material. Instead of soldering, other techniques such as brazing, application of an adhesive, friction fitting, or so forth can be employed to seal the generally planar first principal wall 216 with the open end of the second principal wall 218.

The electrical conduit 236 passes through the sealed interior volume 222 and electrically connects the printed circuitry 234 with an electrical connector 250 disposed at the closed end of the second principal wall 218. In the illustrated embodiment, the electrical connector 250 includes two prongs 254, 256, and the light emitting package 210 is shaped and electrically configured to fit into a standard MR or PAR type lamp fixture. Those skilled in the art can readily adapt the light emitting package 210 to comport with an Edison-type or other type of lamp fixture. Moreover, those skilled in the art can readily adapt the light emitting package 210 for other lighting applications besides insertion into lamp fixtures.

When electrical power is applied to the light emitting diode devices 212 via the electrical connector 250, light is emitted and the first principal wall 216 heats up due to heat produced by the light emitting diode devices 212. The heat pipe 224 cools the first principal wall 216, and hence the light emitting diode devices 212, through a closed evaporation/condensation cycle in which the heat transfer fluid 226 evaporates in the vicinity of the first principal wall 216, condenses at or near the condenser 232, and returns in liquid form to the first principal wall 216 via capillary or wicking action supported by the wicking structures 230. The liquid phase will tend to diffuse laterally across the first principal wall 216. Optionally, additional wicking structures are provided on the first principal wall 216 to enhance lateral distribution of the liquid phase of the heat transfer fluid 226 across the first principal wall 216.

Figure 6:
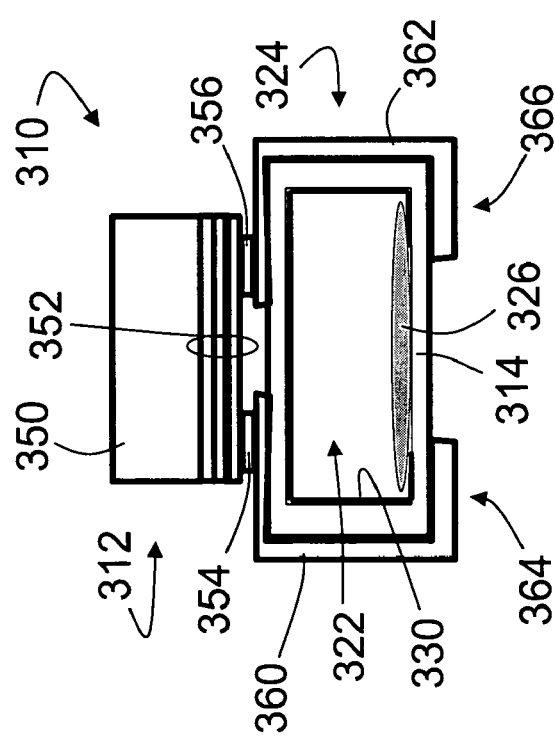
FIG. 6 shows a sectional view of a flip-chip light emitting diode component including a sub-mount with an integral passive heat pipe.

With reference to FIG. 6, a light emitting apparatus 310 includes a light emitting diode die or chip 312 flip-chip bonded to a sub-mount 314. The sub-mount 314 includes a sealed interior volume 322 of a passive heat pipe 324 that includes a heat transfer fluid 326 disposed inside the sealed volume 322. Optionally, wicking structures 330 lining interior surfaces of a portion or all of the walls defining the sealed volume 322 promote transfer of the liquid phase of the heat transfer fluid 326 from cooler regions to hotter regions. In the flip-chip arrangement of the light emitting package 310, the light emitting diode chip 312 includes a substrate 350 that is substantially light transmissive for light generated by device layers 352. Without limiting to any particular light emitting diode chip, by way of example in some embodiments the substrate 350 may be sapphire, silicon carbide, or gallium nitride, and the device layers 352 may be group III-nitride semiconductor layers such as gallium nitride layers, aluminum nitride layers, indium nitride layers, and ternary and quaternary alloys thereof, with each layer doped n-type or p-type intentionally or through background doping so that the device layers 352 collectively define a p/n or n/p group III-nitride light emitting diode.

Front-side electrodes 354, 356 formed on the device layers 352 are flip-chip bonded to printed circuitry, such as respective electrical conductors 360, 362, of the sub-mount 314. In the illustrated embodiment, the electrical conductors 360, 362 are conductive traces that wrap around from the side of the sub-mount 314 on which the light emitting diode chip 312 is flip-chip bonded to the opposite side of the sub-mount 314, where the conductive traces 360, 362 provide bonding surfaces 364, 366 for surface mounting the light emitting package or component 310 to electrical pads of an associated printed circuit board, electrical system, or other support.

In operation, the light emitting diode chip 312 produces heat that is conducted to the sub-mount 314. The heat transfer fluid 326 undergoes an evaporation/condensation cycle that promotes distribution of this heat through the sub-mount 314 to avoid hotspots, and also promotes transfer of heat to the bonding surfaces 364, 366 where the heat may be absorbed by the associated printed circuit board, electrical system, or other support. The heat transfer is by a closed-cycle evaporation/condensation cycle involving evaporation near the die attach surface and condensation distal from the die attach surface. Moreover, the heat pipe 324 may advantageously also remove heat from the electrical conductors 360, 362 wrapped around the sub-mount 314.

Figure 7:
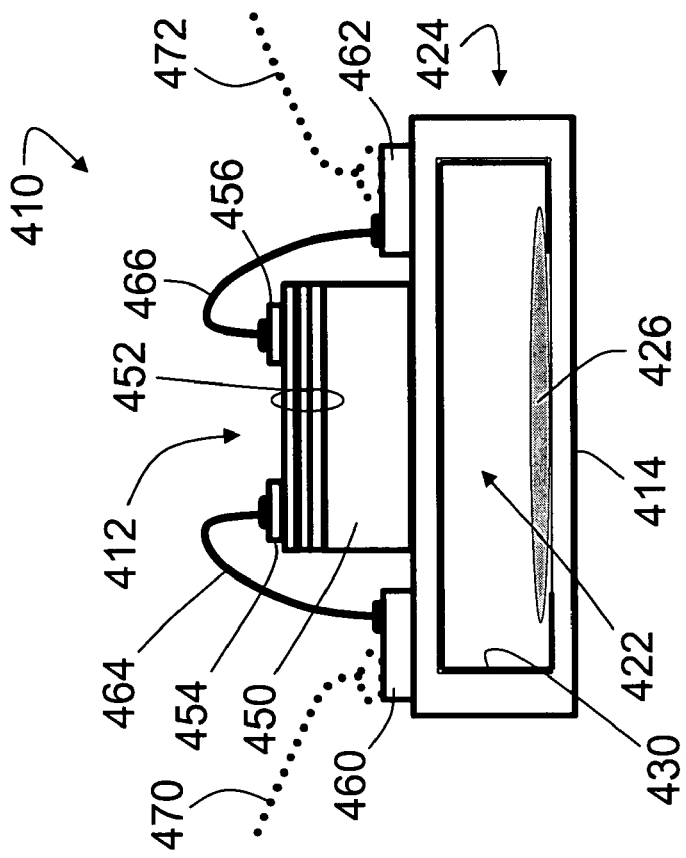
FIG. 7 shows a sectional view of a non-inverted, wire-bonded light emitting diode component including a sub-mount with an integral passive heat pipe.

With reference to FIG. 7, a light emitting apparatus 410 includes a light emitting diode die or chip 412 bonded in a non-inverted orientation to a sub-mount 414. The sub-mount 414 includes a sealed volume 422 of a passive heat pipe 424 including a heat transfer fluid 426 disposed inside the sealed volume 422. Optionally, wicking structures 430 lining interior surfaces of a portion or all of the walls defining the sealed volume 422 promote capillary transfer of the liquid phase of the heat transfer fluid 426. The heat pipe 424 spreads heat and transfers heat away from the light emitting diode chip 412 through a closed evaporation/condensation cycle. In the non-inverted arrangement of the light emitting package 410, the light emitting diode chip 412 includes a substrate 450, which may be transparent or opaque, supporting device layers 452. Without limiting to any particular light emitting diode chip, by way of example in some embodiments the substrate 450 may be sapphire, silicon carbide, or gallium nitride, and the device layers 452 may be group III-nitride semiconductor layers such as gallium nitride layers, aluminum nitride layers, indium nitride layers, and ternary and quaternary alloys thereof, with each layer doped n-type or p-type intentionally or through background doping so that the device layers 452 collectively define a p/n or n/p group III-nitride light emitting diode.

Front-side electrodes 454, 456 formed on the device layers 452 are electrically connected with printed circuitry, such as bonding pads 460, 462, of the sub-mount 414 via wire bonds 464, 466. The side of the sub-mount 414 opposite from the side on which the light emitting diode chip 412 is disposed is preferably adapted to be soldered or otherwise secured to an associated printed circuit board, electrical system, or other support. In the illustrated embodiment, the bonding pads 460, 462 are large enough to allow the light emitting package or component 410 to be electrically connected to the associated printed circuit board, electrical system, or other support by an associated second set of wire bonds 470, 472 (portion of the associated wire bonds 470, 472 are shown in phantom in FIG. 7). Alternatively, a second set of bonding pads can be provided on the sub-mount for connecting the light emitting component with the associated printed circuit board, electrical system, or other support.

FIGS. 6 and 7 illustrate two embodiments of light emitting diode packages or components, in which each illustrated embodiment has a sub-mount which is also a sub-mount with integrated heat pipe. The inventors have estimated that a high brightness light emitting diode package producing about 1.3 W of heat and employing an aluminum nitride sub-mount with a 2.12 K/W average thermal resistance produces a temperature gradient of about 2.75° C.

across the sub-mount. In contrast, by incorporating the heat pipes 324, 424 into the sub-mounts 314, 414, the sub-mount thermal resistance can be expected to be reduced to below 0.04 K/W, and the resulting temperature gradient is expected to be less than about 0.05° C. Similarly, a high brightness light emitting diode package producing about 5 W of heat and employing the aluminum nitride sub-mount with 2.12 K/W average thermal resistance produces a temperature gradient of about 10.6° C. across the sub-mount. The sub-mounts 314, 414 incorporating chemical heat pipes 324, 424 can be expected to reduce this thermal gradient to less than about 0.2° C.

In any of the illustrated embodiments or their equivalents, the printed circuitry can, in addition to electrically connecting the light emitting diode devices with an electrical power source, also electrically interconnect the light emitting diode devices with other electrical or optoelectronic components, such as zener diode-based electrostatic discharge protection circuits, photodiode-based intensity feedback-control circuits, or the like. Such other electrical or optoelectronic components can, for example, be mounted on the printed circuit boards 40, 140, 240 or on the sub-mounts 314, 414.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The appended claims follow:
The invention claimed is:

1. A light emitting apparatus comprising:
one or more light emitting diode chips; and
a passive heat pipe including (i) a generally planar chip support wall on which the one or more light emitting diode chips are disposed, (ii) at least one additional wall sealed with the chip support wall to define a closed interior volume, (iii) a heat transfer fluid disposed in the closed interior volume, and (iv) one or more wicking structures disposed at least on an interior surface of the chip support wall, the portion of the wicking structure disposed on the interior surface of the chip support wall including radiating wicks radiating outward toward edges of the chip support wall.

2. The light emitting apparatus as set forth in claim 1, wherein the passive heat pipe further comprises:
an annular condenser arranged around the radiating wicks.

3. The light emitting apparatus as set forth in claim 1, further comprising:
printed circuitry disposed on or in the chip support wall and electrically connecting with the light emitting diode chips.

4. The light emitting apparatus as set forth in claim 1, wherein the passive heat pipe defines a sub-mount on which the one or more light emitting diode chips are attached.

5. The A light emitting apparatus comprising:
one or more light emitting diode chips; and
a passive heat pipe including (i) a generally planar chip support wall on which the one or more light emitting diode chips are disposed, (ii) at least one additional wall sealed with the chip support wall to define a closed interior volume, (iii) a heat transfer fluid disposed in the closed interior volume, and (iv) one or more wicking structures disposed at least on an interior surface of the chip support wall, the chip support wall of the passive heat pipe including a metal core sealed with at least one additional wall to define the closed interior volume, one or more insulating layers disposed on the metal core, and printed circuitry disposed on or between the one or more insulating layers and electrically connecting with the at least one light emitting diode chip.

6. The light emitting apparatus as set forth in claim 5, wherein the one or more wicking structures include one or more wicking structures disposed on at least a portion of the at least one additional wall.

7. A light emitting apparatus comprising:
one or more light emitting diode chips;
a metal core printed circuit board on which the light emitting diode chips are disposed, the metal core printed circuit board including printed circuitry connecting with the light emitting diode chips; and
a heat pipe having walls including a metal core of the metal core printed circuit board sealed with at least one additional wall to define a sealed volume of the heat pipe, the heat pipe further including a heat transfer fluid disposed in the sealed volume.

8. The light emitting apparatus as set forth in claim 7, wherein the metal core of the metal core printed circuit board is soldered to the at least one additional wall to define the sealed volume of the heat pipe.

9. The light emitting apparatus as set forth in claim 7, wherein the metal core of the metal core printed circuit board is generally planar and the at least one additional wall includes a backside wall generally parallel with the generally planar metal core, the sealed volume being defined by a gap between the metal core and the backside wall.

10. The light emitting apparatus as set forth in claim 7, wherein the heat pipe further comprises:
a wicking structure disposed inside the sealed volume on an inside surface of the at least one additional wall.

11. The light emitting apparatus as set forth in claim 7, wherein the heat pipe further comprises:
a wicking structure disposed inside the sealed volume on an inside surface of the metal core of the metal core printed circuit board.

12. The light emitting apparatus as set forth in claim 7, wherein the printed circuitry includes bonding pads electrically connected with electrodes of the one or more light emitting diode chips by one of flip chip bonding and wire bonding.

13. A light emitting apparatus comprising:
at least one light emitting diode chip; and
a passive heat pipe having a sealed volume defined by (i) a chip support wall on which the at least one light emitting diode chip is disposed, (ii) a backside wall, and (iii) one or more sidewalls extending between the chip support wall and the backside wall, a separation between the chip support wall and the backside wall being smaller than a lateral dimension of the chip support wall, the heat pipe further including a heat transfer fluid disposed in the sealed volume.

14. The light emitting apparatus as set forth in claim 13, wherein the heat pipe further comprises:
a wicking structure disposed inside the sealed volume on at least one of the chip support wall and the backside wall.

15. The light emitting apparatus as set forth in claim 13, wherein the heat pipe defines a sub-mount, the at least one light emitting diode chip being attached to the sub-mount.

16. The light emitting apparatus as set forth in claim 15, wherein the sub-mount includes one or more conductive traces disposed on the chip support wall and electrically connecting with electrodes of the at least one light emitting diode chip.

17. The light emitting apparatus as set forth in claim 16, wherein the electrodes are one of (i) flip chip bonded, and (ii) wire bonded, to the one or more conductive traces.

18. The light emitting apparatus as set forth in claim 13, wherein the chip support wall of the heat pipe includes a printed circuit board having printed circuitry electrically connecting with the at least one light emitting diode chip.

* * * * *